United States Patent
Kaneko et al.

(10) Patent No.: US 10,201,917 B2
(45) Date of Patent: Feb. 12, 2019

(54) LEAD FRAME

(71) Applicant: SHINKO ELECTRIC INDUSTRIES CO., LTD., Nagano-shi, Nagano (JP)

(72) Inventors: Kentaro Kaneko, Nagano (JP); Tsuyoshi Kobayashi, Nagano (JP); Yoshio Furuhata, Nagano (JP); Shigeri Nakamura, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/880,011

(22) Filed: Jan. 25, 2018

(65) Prior Publication Data

US 2018/0236696 A1 Aug. 23, 2018

(30) Foreign Application Priority Data

Feb. 17, 2017 (JP) ................................. 2017-028221

(51) Int. Cl.
| | |
|---|---|
| *H01L 23/495* | (2006.01) |
| *B29C 37/02* | (2006.01) |
| *H01L 23/50* | (2006.01) |
| *H01L 21/48* | (2006.01) |
| *H01L 21/67* | (2006.01) |
| *H01L 23/492* | (2006.01) |

(52) U.S. Cl.
CPC .......... *B29C 37/02* (2013.01); *H01L 21/4828* (2013.01); *H01L 21/4842* (2013.01); *H01L 21/6708* (2013.01); *H01L 23/4924* (2013.01); *H01L 23/49513* (2013.01); *H01L 23/49534* (2013.01); *H01L 23/49548* (2013.01); *H01L 23/50* (2013.01); *H01L 23/49541* (2013.01); *H01L 2224/48247* (2013.01)

(58) Field of Classification Search
CPC ............... B29C 37/02; H01L 23/49541; H01L 23/49548; H01L 23/48; H01L 23/495
USPC ......................................................... 257/666
See application file for complete search history.

(56) References Cited

U.S. PATENT DOCUMENTS

| | | | | |
|---|---|---|---|---|
| 4,862,246 | A * | 8/1989 | Masuda .............. | H01L 21/4828 257/666 |
| 6,638,790 | B2 * | 10/2003 | Minamio ............ | H01L 21/4842 438/111 |
| 6,949,816 | B2 * | 9/2005 | Brown ............... | A61B 5/14546 257/684 |
| 7,042,068 | B2 * | 5/2006 | Ahn ..................... | H01L 23/3107 257/666 |
| 7,087,462 | B1 * | 8/2006 | Park ..................... | H01L 21/561 438/112 |
| 8,519,518 | B2 * | 8/2013 | Do ...................... | H01L 21/4832 257/666 |
| 9,966,517 | B2 * | 5/2018 | Oda .................... | H01L 21/6835 |

(Continued)

FOREIGN PATENT DOCUMENTS

| | | |
|---|---|---|
| JP | 2004-319816 | 11/2004 |
| JP | 2013-058693 | 3/2013 |

*Primary Examiner* — Nitin Parekh
(74) *Attorney, Agent, or Firm* — Rankin, Hill & Clark LLP

(57) ABSTRACT

A lead frame includes an outer frame. The outer frame includes: one surface; another surface that is opposite to the one surface; a side surface between the one surface and the other surface; a recess that is formed to extend from the one surface to the side surface; and a notch step portion that is formed to extend from the other surface to the side surface.

5 Claims, 17 Drawing Sheets

(PARTIAL PERSPECTIVE VIEW)

(56) References Cited

U.S. PATENT DOCUMENTS

| | | | |
|---|---|---|---|
| 2004/0084757 A1* | 5/2004 | Seo | H01L 21/4828 257/672 |
| 2004/0238923 A1* | 12/2004 | Lee | H01L 23/3107 257/670 |
| 2012/0126378 A1* | 5/2012 | San Antonio | H01L 21/561 257/659 |
| 2014/0264426 A1* | 9/2014 | Yamashita | H01L 33/54 257/99 |
| 2016/0155917 A1* | 6/2016 | Yamashita | H01L 23/495 257/99 |
| 2016/0254214 A1* | 9/2016 | Makino | H01L 24/97 257/676 |
| 2016/0293817 A1* | 10/2016 | Oda | H01L 24/97 |

* cited by examiner (PARTIAL ENLARGED PERSPECTIVE VIEW)

W2 > L1

(PARTIAL ENLARGED PERSPECTIVE VIEW)

(PARTIAL PERSPECTIVE VIEW)

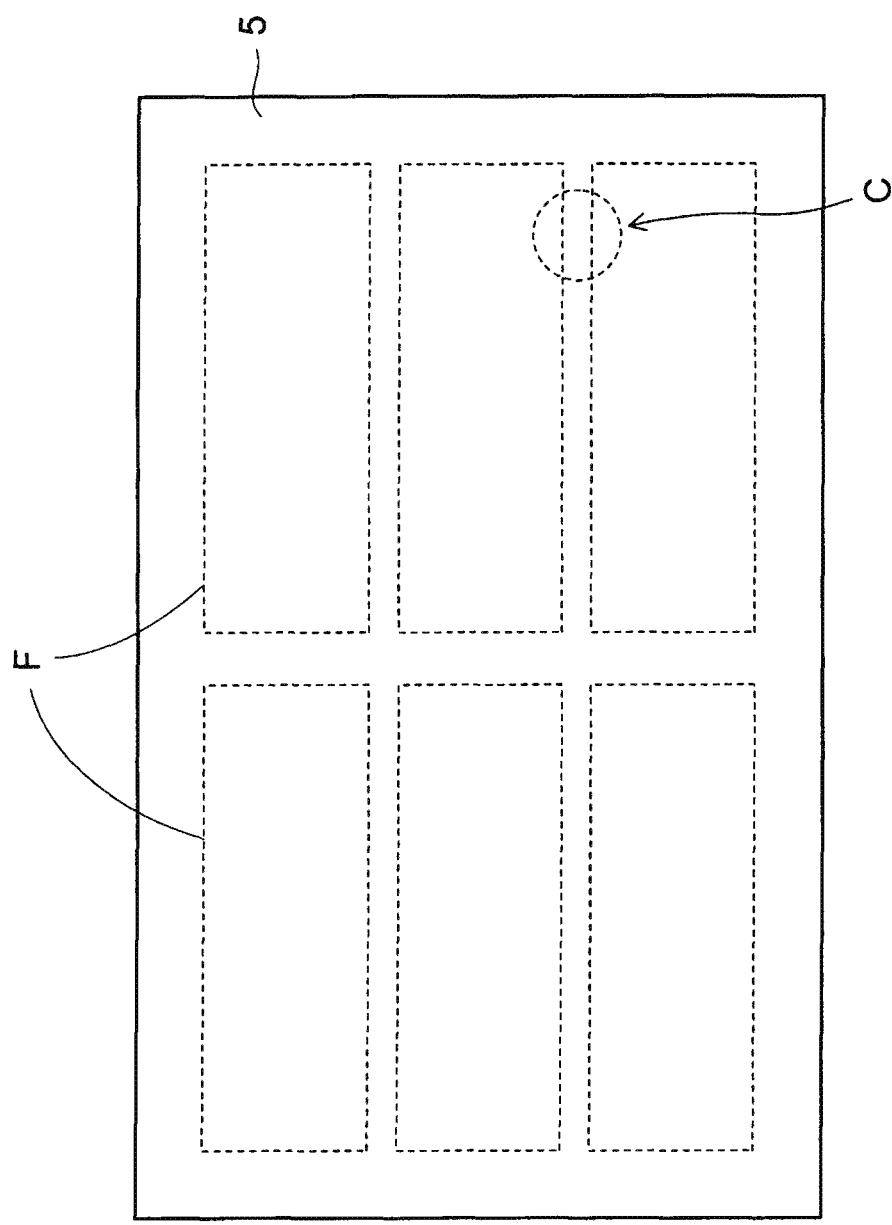

UPPER SURFACE SIDE (PARTIAL ENLARGED PLAN VIEW)

LOWER SURFACE SIDE (PARTIAL ENLARGED PLAN VIEW)

(MODIFICATION)

FIG. 12A
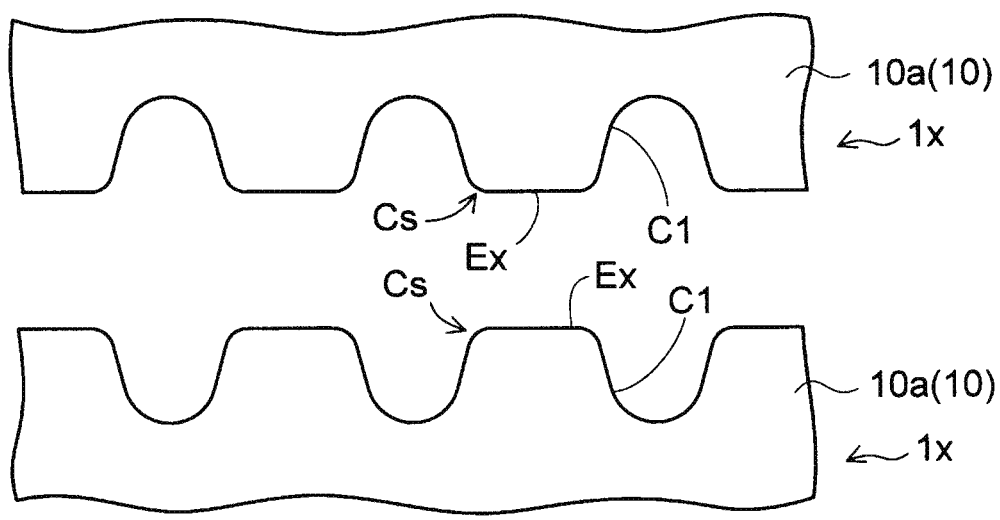
UPPER SURFACE SIDE (PARTIAL ENLARGED PLAN VIEW)
FIG. 12B
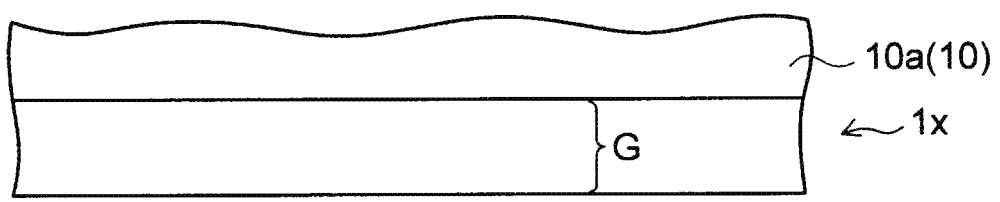
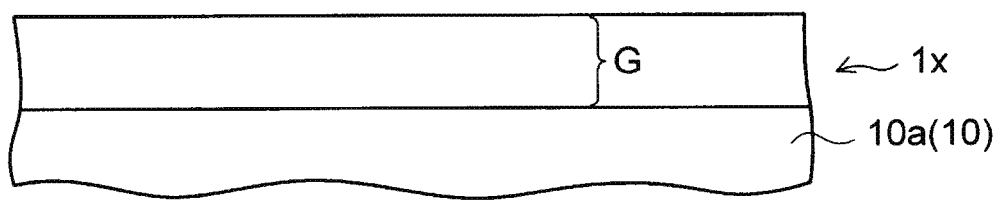
LOWER SURFACE SIDE (PARTIAL ENLARGED PLAN VIEW)

LEAD FRAME

This application claims priority from Japanese Patent Application No. 2017-028221, filed on Feb. 17, 2017, the entire contents of which are herein incorporated by reference.

BACKGROUND

1. Technical Field

The present disclosure relates to a lead frame.

2. Background Art

In the background art, there are lead frames for mounting electronic components such as semiconductor chips thereon. In such a lead frame, a semiconductor chip which has been mounted on a die pad are connected to ambient leads by wires, and the semiconductor chip and the wires are sealed with a sealing resin (e.g. see JP-A-2004-319816 and JP-A-2013-58693).

As will be described in an undermentioned preliminary matter, when the lead frame provided with an outer frame shaped to have long sides is stored in a frame stocker, there is a problem that right-angled portions of long side surfaces of the outer frame may contact and rub inner walls of the frame stocker to thereby cause occurrence of burrs.

SUMMARY

An object of the present disclosure is to provide a lead frame having a novel structure which can prevent burrs from occurring at side surfaces of an outer frame of the lead frame.

According to one or more aspects of the present disclosure, there is provided a lead frame. The lead frame comprises an outer frame. The outer frame comprises:
one surface;
another surface that is opposite to the one surface;
a side surface between the one surface and the other surface;
a recess that is formed to extend from the one surface to the side surface; and
a notch step portion that is formed to extend from the other surface to the side surface.

BRIEF DESCRIPTION OF DRAWINGS

FIG. 9 is a plan view (Part 1) showing a manufacturing method of the lead frame according to the embodiment;

FIGS. 12A and 12B are plan views (Part 4) showing the manufacturing method of the lead frame according to the embodiment;

DETAILED DESCRIPTION

An embodiment will be described below with reference to the accompanying drawings.

A preliminary matter underlying the embodiment will be described prior to description of the embodiment.

Figure 1A:
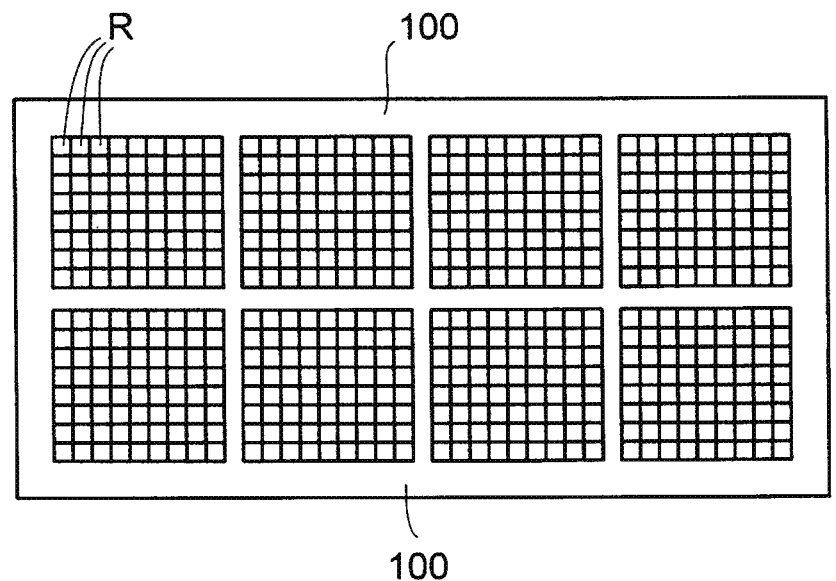
FIGS. 1A and 1B are a plan view and a perspective view for explaining a lead frame according to a preliminary matter.
Figure 1B:
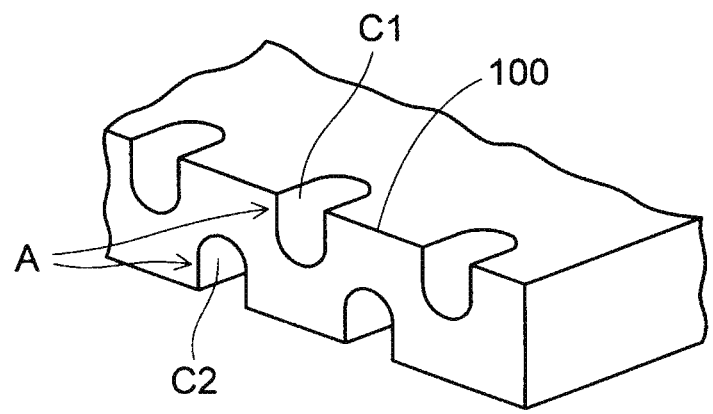

FIGS. 1A and 1B are views for explaining a lead frame according to the preliminary matter. Description of the preliminary matter is about the details of personal study of the present inventor, which contain techniques not belonging to known techniques.

As shown in FIG. 1A, the lead frame according to the preliminary matter is provided with an outer frame 100. The outer frame 100 has an oblong outer shape. A plurality of product regions R are defined inside the outer frame 100. A die pad and leads (not shown) coupled to the outer frame 100 are disposed in each of the product regions R.

The lead frame is stored in a frame stocker (not shown) in a manufacturing process of building semiconductor devices or during transportation. The frame stocker is made of metal.

A plurality of rails are provided side by side in an up/down direction on each of inner walls of opposed side plates of the frame stocker. Opposite edge portions of the outer frame 100 on long sides of the lead frame are disposed on the rails on the opposite sides of the frame stocker. Thus, a plurality of lead frames can be stored in the frame stocker.

When a lead frame is taken into or out of the frame stocker. long side surfaces of an outer frame 100 of the lead frame contact and rub the inner walls of the side plates of the frame stocker.

Therefore, burrs are apt to occur at the side surfaces of the outer frame 100 of the lead frame and the inner walls of the side plates of the frame stocker. When a burr occurring thus separates from the lead frame, the burr is apt to scatter onto a region where a die pad or a lead of the lead frame has been disposed.

When the burr has a length longer than a distance between the die pad and the lead or a distance between the lead and another lead adjacent thereto, the die pad and the lead or the adjacent leads are connected to each other through the burr. As a result, electric short-circuiting occurs.

As a measure to cope with the problem, first recesses C1 and second recesses C2 are formed in an upper surface and a lower surface of each of outer edge portions of the outer frame 100 of the lead frame in FIG. 1A to extend to the middle of a thickness of the outer edge portion of the outer frame 100, as shown in a partial perspective view of FIG. 1B.

Thus, a length of each of right-angled portions of the side surfaces of the outer frame 100 of the lead frame is shortened. Therefore, even when a burr occurs, the length of the burr is shorter. As a result, it is possible to educe the risk that a die pad and a lead or leads adjacent to each other may be connected to each other through the burr.

However, each portion (portion A in FIG. 1B) where an inner wall of the first recess C1 or an inner wall of the second recess C2 borders on a side surface of the outer frame 100 is formed at a sharp right angle. Therefore, a burr is apt to occur at the portion. To solve this problem, it is desirable to form a structure in which occurrence of burrs can be suppressed better than in the structure of the side surface of the outer edge portion of the outer frame 100 of the lead frame in FIG. 1B.

The aforementioned problem can be solved by a lead frame according to the embodiment which will be described below.

(Embodiment)

FIGS. 2 to 8 are views for explaining the lead frame according to the embodiment. FIGS. 9 to 13 are views for explaining a manufacturing method of the lead frame according to the embodiment.

Figure 2:
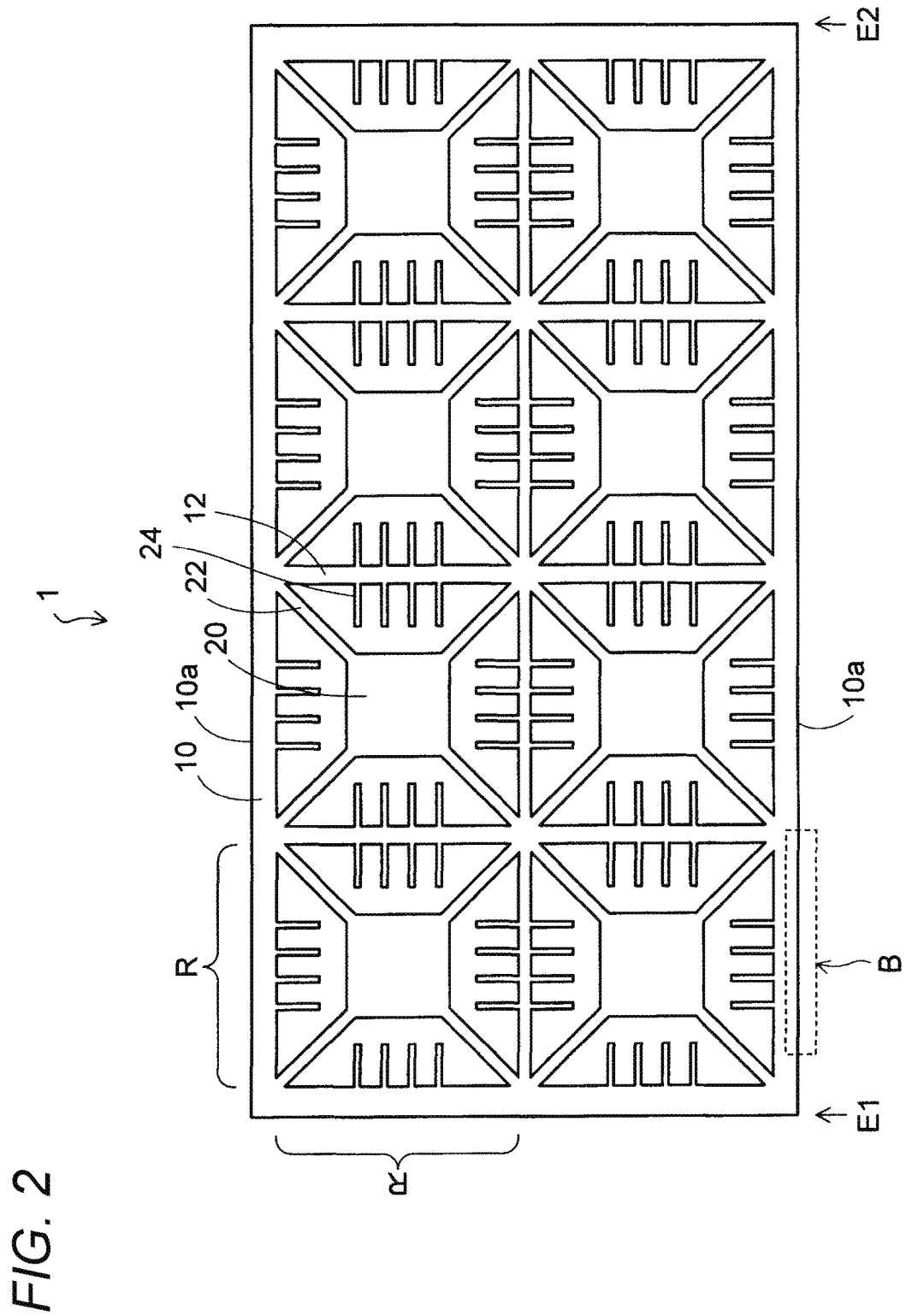
FIG. 2 is a plan view of a lead frame according to an embodiment.

As shown in FIG. 2, the lead frame 1 according to the embodiment as a frame structure which is formed by an outer frame 10 and an inner frame 12. The outer frame 10 has an oblong (rectangular) outer shape. The inner frame 12 is coupled to the outer frame 10. In the oblong shape of the outer frame 10, a pair of frame portions extending horizontally are longer in length than a pair of frame portions extending vertically.

Each of square regions defined by the outer frame 10 and the inner frame 12 serves as one product region R. A square die pad 20 is disposed in a central portion of the product region R. In addition, support bars 22 are connected to four corners of the die pad 20 respectively. The support bars 22 are coupled to the outer frame 10 and the inner frame 12.

In this manner, the die pad 20 is supported in the outer frame 10 and the inner frame 12 by the four support bars 22.

Further, four leads 24 are provided on each side. The leads 24 are coupled to the outer frame 10 and the inner frame 12 which are opposed to the four sides of the die pad 20 of the product region R. In the product region R, the leads 24 extend from inner walls of the outer frame 10 and the inner frame 12 toward the die pad 20 provided inside the product region R.

In the example of the lead frame 1 in FIG. 2, 2×4 product regions R are provided. However, the number or the layout of the product regions R provided in one lead frame 1 can be set desirably.

The lead frame 1 according to the embodiment can be manufactured by wet-etching and patterning a metal plate from its opposite surface sides. The lead frame 1 is formed of the metal plate made of copper, a copper alloy, an iron-nickel alloy, or the like. Preferably, a nickel (Ni) layer/a palladium (Pd) layer/a gold (Au) layer are formed on the whole of the lead frame 1 including upper, lower and side surfaces thereof, in the named order from bottom to top by electroplating.

Alternatively, the nickel (Ni) layer/the palladium (Pd) layer/the gold (Au) layer may be formed only on upper surfaces of the leads 24 to be wire-bonded, in the named order from bottom to top.

In addition, a single silver (Ag) layer may be formed by electroplating in place of the nickel (Ni) layer/the palladium (Pd) layer/the gold (Au) layer.

Figure 3:
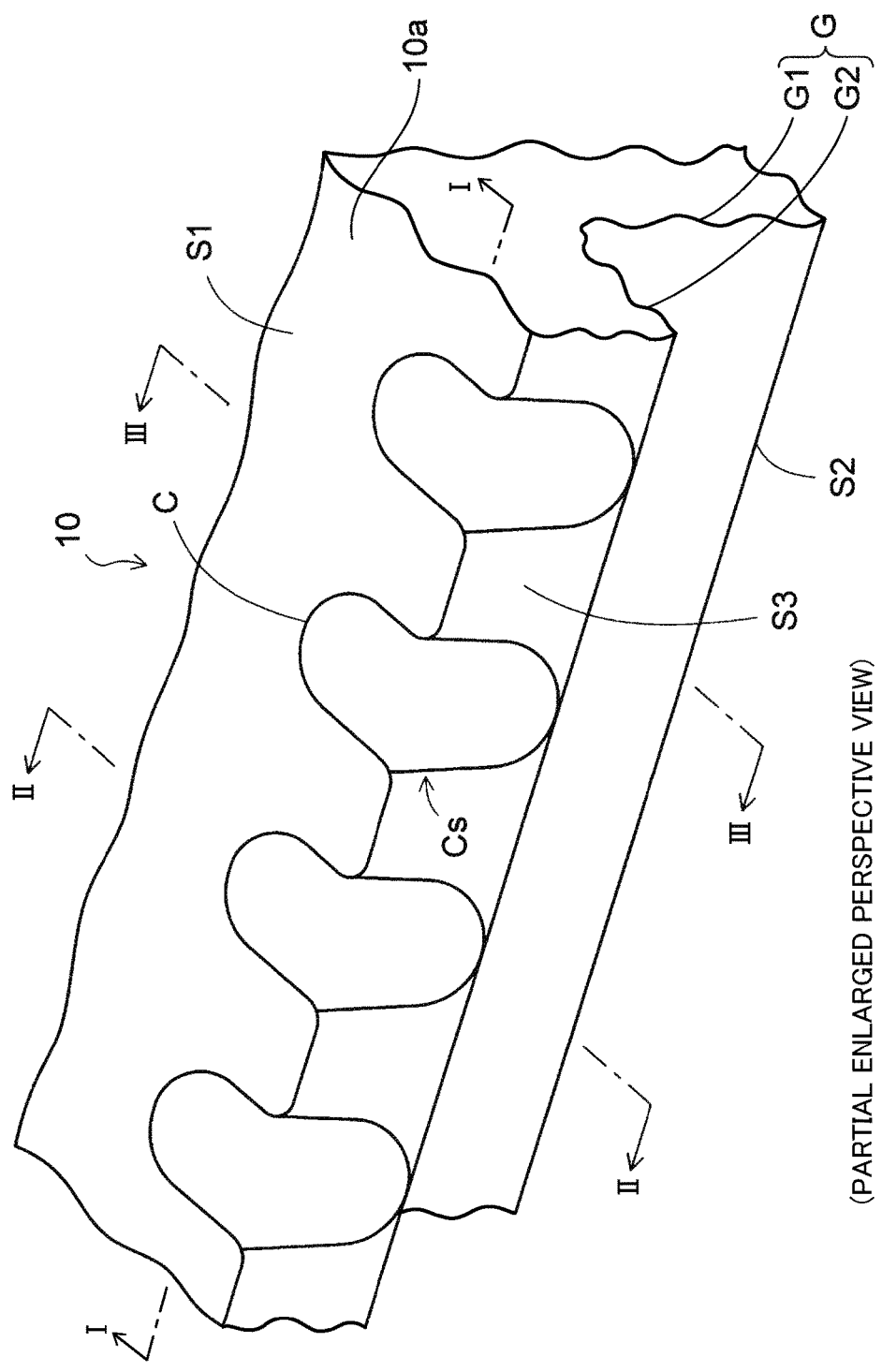
FIG. 3 is a partial enlarged perspective view showing a long side surface of an outer frame of the lead frame in FIG. 2.

FIG. 3 is a partial enlarged perspective view showing an enlarged side surface (portion designated by B) of an outer edge portion 10a of the outer frame 10 of the lead frame 1 in FIG. 2.

In the embodiment, one surface of the outer frame 10 of the lead frame 1 will be described as upper surface, and another surface of the outer frame 10 will be described as lower surface. Or in an inverted manner, one surface of the outer frame 10 may be described as lower surface, and another surface of the outer frame 10 may be described as upper surface.

As shown in FIG. 3, the outer edge portion 10a of the outer frame 10 of the lead frame 1 is provided with an upper surface S1, a lower surface S2, and a side surface S3. A plurality of recesses C are formed to extend from the upper surface S1 of the outer edge portion 10a of the outer 10 of the lead frame 1 to the side surface S3 thereof.

The recesses C are formed to extend from the upper surface S1 of the outer edge portion 10a of the outer frame 10 to the middle of a thickness of the outer edge portion 10a. Horizontal opening ends of the recesses C are exposed from the side surface S3 of the outer edge portion 10a of the outer frame 10. The plurality of recesses C are disposed side by side at predetermined intervals along the side surface S3 of the outer edge portion 10a of the outer frame 10.

In addition, a notch step portion G is formed to extend from the lower surface S2 of the outer edge portion 10a of the outer frame 10 of the lead frame 1 to the side surface S3 thereof. The notch step portion G is formed integrally in a whole range of from one long-side end E1 of the outer frame 10 of the lead frame 1 to the other long-side end E2 thereof in FIG. 2.

When the notch step portion G in FIG. 3 is viewed sideways, the notch step portion G is formed into an inverted L-shape. The notch step portion G is formed by a notch side surface G1 and a notch upper surface G2. The notch side surface G1 is set back inward from the side surface S3 of the outer frame 10. The notch upper surface G2 borders on an upper end of the notch side surface G1.

The notch step portion G is formed to extend from a lower portion of the side surface S3 of the outer frame 10 to the widthwise middle of the side surface S3. The notch step portion G is exposed from the side surface S3 of the outer frame 10.

The notch step portion G is formed at the lower portion of the side surface S3 of the outer frame 10. In this manner, a lower end of the side surface S3 of the outer edge portion 10a of the outer frame 10 is set back inward.

Figure 4A:
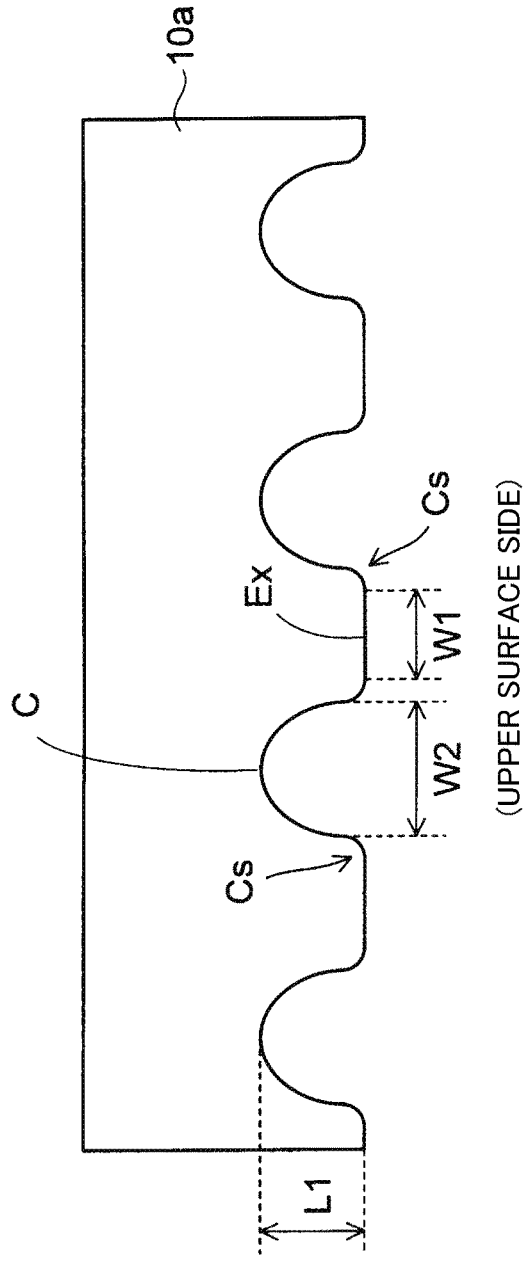
FIGS. 4A and 4B are partial plan views showing the long side surface of the outer frame of the lead frame in FIG. 2.
Figure 4B:
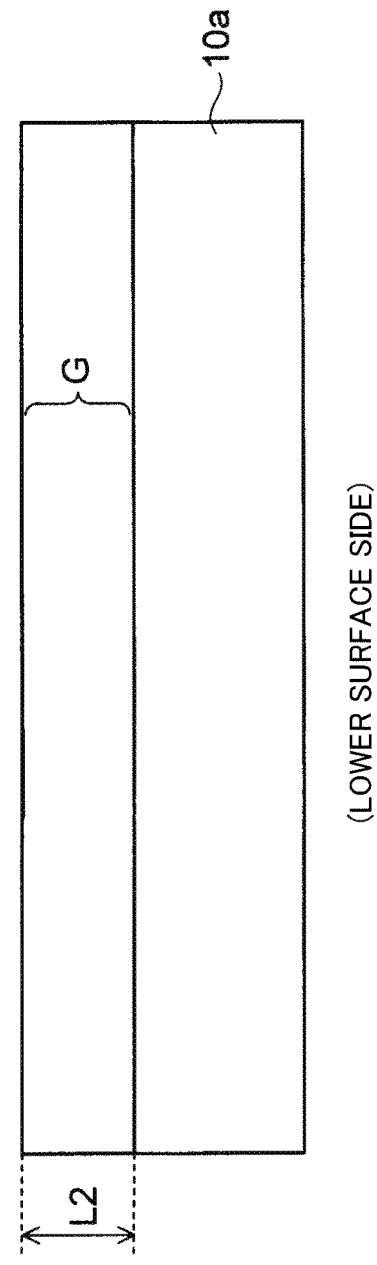

FIG. 4A is a partial plan view of FIG. 3, as seen from top. FIG. 4B is a partial plan view of FIG. 3, as seen from bottom. As shown in FIGS. 4A and 4B, each of the recesses C is formed as a curved recess in plan view. For example, a semicircular recess is illustrated as the recess C in plan view.

Refer to FIG. 4A in addition to FIG. 3. A portion where a side wall of each of the recesses C borders on the side surface of the outer edge portion 10a of the outer frame 10 is rounded and formed into a curved surface shape so as to serve as a round surface Cs. Thus, a side wall portion of the horizontal opening end of the recess C is rounded and formed into the round surface Cs. In FIG. 4A, a line of the bottom of the recess C is omitted in order to simplify illustration.

In addition, refer to FIG. 4B in addition to FIG. 3. The notch step portion G is formed integrally to extend from the one long-side end E1 of the lower portion of the side surface of the outer frame 10 to the other long-side end E2 thereof in FIG. 2. Alternatively, the notch step portion G may be divided into a plurality of parts and disposed in a region ranging from the one long-side end E1 of the lower portion of the side surface of the outer frame 10 to the other long-side end E2 thereof in FIG. 2.

Roundness of the round surface Cs of the recess C is set in a range of from R 0.01 mm to R 0.1 mm. The R 0.01 mm corresponds to an arc shape of a circle having a radium of 0.01 mm. The R 0.1 mm corresponds to an arc shape of a circle having a radium of 0.1 mm.

In addition, as shown in FIG. 4A, of an upper end of the side surface of the outer frame 10, a portion between adjacent ones of the recesses C is formed as a flat portion Ex which is linear in plan view. A width W1 of the flat portion Ex measures, for example, 0.01 mm to 0.1 mm. The portion of the upper end of the side surface of the outer frame 10 is a portion where the side surface and the upper surface border on each other. A width W2 of the recess C is set, for example, in a range of from 0.1 mm to 0.2 mm.

In addition, a depth L1 of the recess C is set, for example, in a range of from 0.1 mm to 0.2 mm. In addition, a depth L2 of the notch step portion G is set, for example, in a range of from 0.05 mm to 0.2 mm.

Here, a different case from the embodiment will be described as follows. That is, of each of the upper ends of the side surfaces of the outer frame 10, a portion between adjacent ones of the recesses C is formed into a semicircular shape connected to the round surface Cs in plan view. In this case, when the metal plate is wet-etched to obtain such a lead frame, the position of a front end of each of the side surfaces of the outer frame 10 of the lead frame is set back inward to cause a variation easily. width of the lead frame according to design specifications cannot be obtained stably.

Further, when the width of the lead frame is measured by image recognition, recognition of an outer edge line of the outer frame 10 may be so unclear that the width cannot be measured accurately.

In the embodiment, of each of the upper ends of the side surfaces of the outer frame 10, the portion between the adjacent recesses C is formed as the flat portion Ex which is linear in plan view. Therefore, when the metal plate is wet-etched to obtain the lead frame 1, the outer frame 10 of the lead frame 1 has more linear portions in the opposite side surfaces in plan view. Accordingly, it is possible to obtain the lead frame having a stable width.

In addition, an outer edge line of the outer frame 10 of the lead frame 1 can be image-recognized clearly. Accordingly, the width can be measured reliably.

Figure 5:
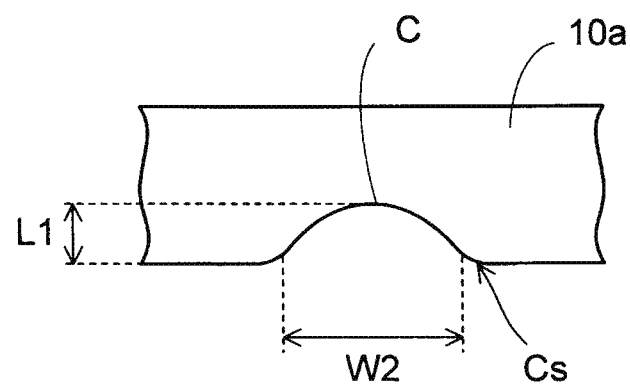
FIG. 5 is a partial plan view showing a modification of a recess in FIG. 4A.

FIG. 5 is a partial plan view showing a modification of the recess C in FIG. 4A. As shown in FIG. 5, the recess C is formed as a curved recess in plan view, and a width W2 of the recess C is made longer than a depth L1 of the recess C. Thus, the round surface Cs is formed into a gently curved shape easily. Therefore, the structure formed thus is more preferable from a viewpoint of suppressing burrs from occurring.

Figure 6A:
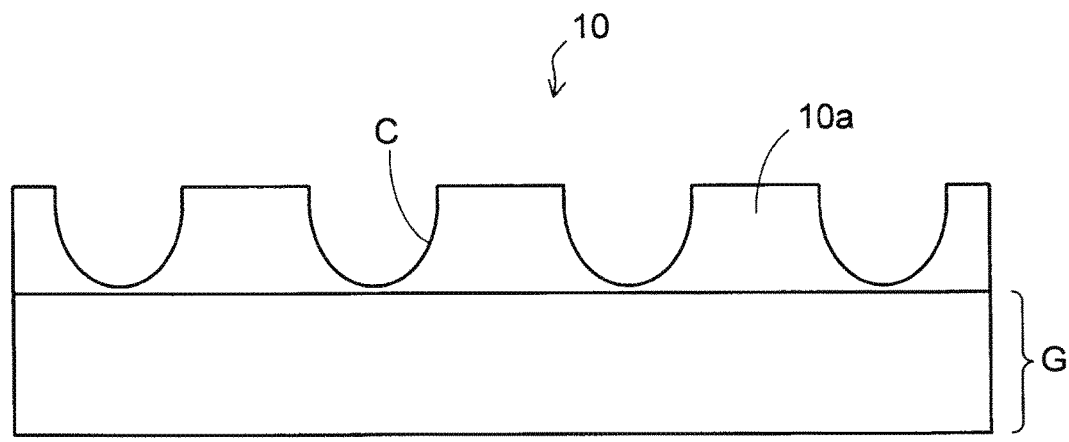
FIG. 6A is a sectional view taken along a line I-I of FIG. 3.

FIG. 6A is a sectional view taken along a line I-I of FIG. 3 passing through a middle position of the depth of each of the recesses C. As shown in FIG. 6A, each of the recesses C which is viewed in section is formed into a U-shape to reach the middle of the thickness of the outer frame 10. The recesses C are formed independently so as not to communicate with one another.

Figure 6B:
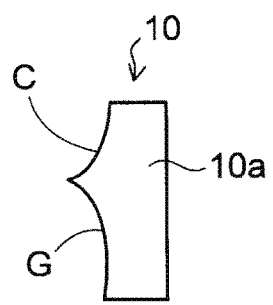
FIG. 6B is a sectional view taken along a line II-II of FIG. 3.
Figure 6C:
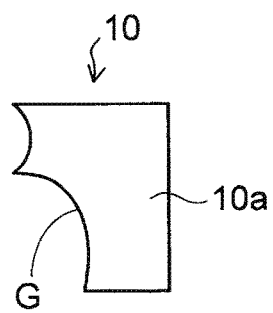
FIG. 6C is a sectional view taken along a line III-III of FIG. 3.

FIG. 6B is a sectional view taken along a line of FIG. 3. FIG. 6C is a sectional view taken along a line III-III of FIG. 3. As will be described later, a large-sized metal plate for forming multiple lead frames is wet-etched from its opposite surface sides so that a plurality of lead frames can be obtained.

Therefore, an inner surface of each of the recesses C and an inner surface of the notch step portions G under the recesses C are formed as concavely curved surfaces, as shown in FIG. 6B.

In a similar manner or the same manner, a portion of an inner surface of the side surface between adjacent ones of the recesses C and the inner surface of the notch step portion G under the recesses C are formed as concavely curved surfaces, as shown in FIG. 6C.

Similar or the same recesses C and similar or the same notch step portion G are also formed in a side surface of the outer frame 10 on an upper side of the lead frame 1 in FIG. 2. Thus, the recesses C and the notch step portions G are formed in a pair of the outer edge portions 10a on the opposite long sides of the outer frame 10 respectively.

Figure 7:
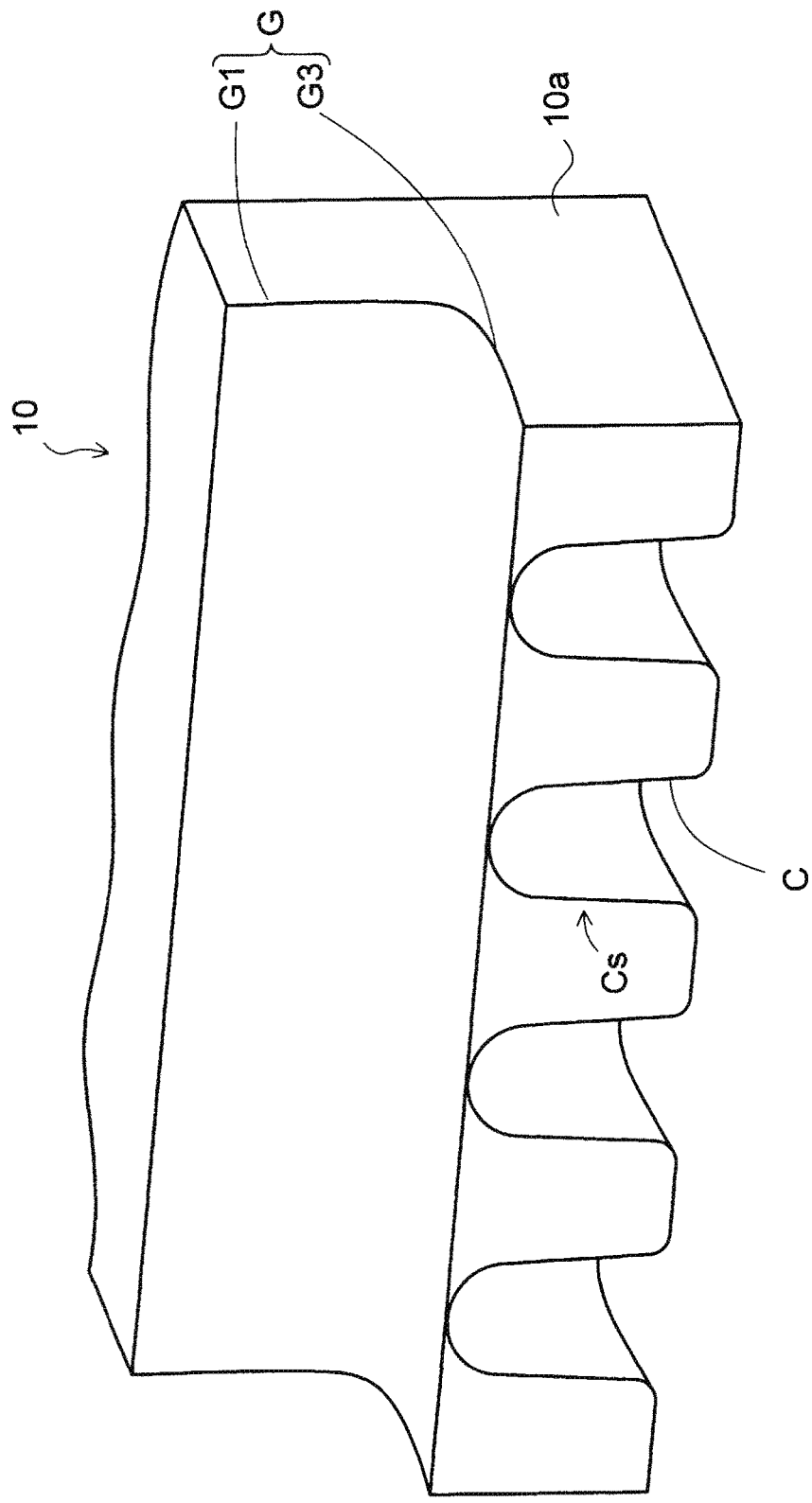
FIG. 7 is a partial enlarged perspective view (modification) showing a long side surface of an outer frame of the lead frame in FIG. 2.

Alternatively, as shown in a modification of FIG. 7, recesses C may be formed to extend from a lower surface of an outer frame 10 to a side surface thereof, reversely to the structure of FIG. 3 so that a collective notch step portion G can be formed to extend from an upper surface of the outer frame 10 to the side surface thereof. In the modification of FIG. 7, the notch step portion G is formed by a notch side surface G1 and a notch lower surface G3.

In the modification of FIG. 7, the recesses C and the notch step portion G in the aforementioned FIG. 3 are formed to be disposed upside down. Accordingly, when turned upside down, the recesses C and the notch step portion G in the modification of FIG. 7 have the same shapes as the recesses C and the notch step portion G in the aforementioned FIG. 3 respectively. Therefore, detailed description of the recesses C and the notch step portion G will be omitted.

Figure 8A:
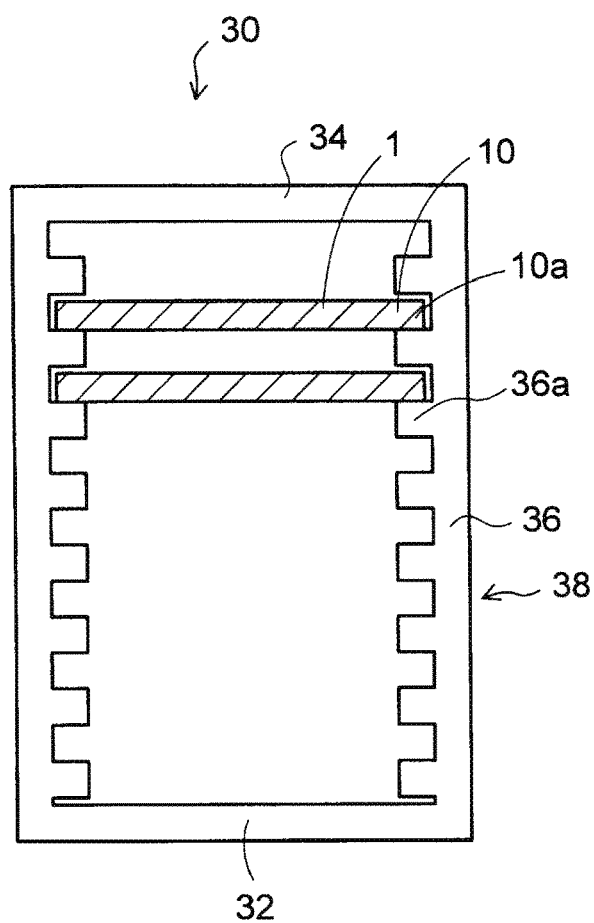
FIG. 8A is a sectional view showing a state in which lead frames in FIG. 2 are stored in a frame stocker.
Figure 8B:
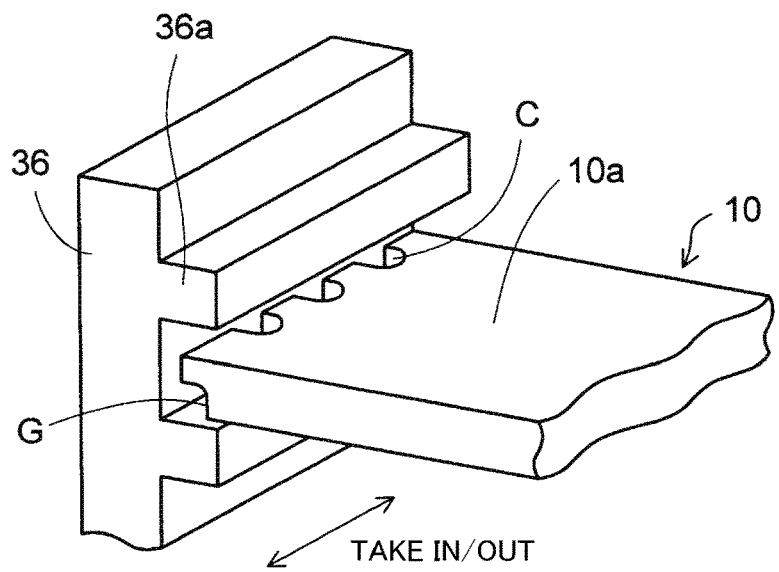
FIG. 8B is a partial perspective view showing a state in which lead frames in FIG. 2 are stored in a frame stocker.

FIGS. 8A and 8B show a frame stocker 30 in which lead frames 1 according to the embodiment are stored. The frame stocker 30 is provided with a box 38 which is built from a bottom plate 32, a top plate 34 and side plates 36. A front surface of the box 38 is opened. A plurality of rails 36a are provided on each of inner walls of the opposed side plates 36 of the box 38.

The box 38 and the rails 36a of the frame stocker 30 are formed out of metal such as stainless steel.

The lead frames 1 in FIG. 2 are stored in the frame stocker 30. Opposite outer edge portions 10a of an outer frame 10 on long sides of each of the lead frames 1 are disposed on the rails 36a on the opposite sides of the frame stocker 30.

As shown in a partial perspective view in 813, when a lead frame 1 is taken into or out of the frame stocker 30, side surfaces of outer edge portions 10a of an outer frame 10 of the lead frame 1 contact and rub the inner walls of the side plates 36 of the frame stocker 30.

On this occasion, in the lead frame 1 according to the embodiment, recesses C are formed on each of upper surface sides of the outer edge portions 10a of the outer frame 10 of the lead frame 1, and a notch step portion G is formed integrally on each of lower surface sides of the outer edge portions 10a, as described above. Further, a portion where each of inner walls of the recesses C borders on each of the side surfaces of the outer frame 10 is rounded and formed into a round surface Cs.

Thus, burrs can be prevented from occurring at the side wall portions of the horizontal opening ends of the recesses C. In addition, the notch step portion G is formed integrally at each of lower portions of the side surfaces of the outer frame 10. Accordingly, the lower portion of the side surface of the outer frame 10 is set back to be disposed at an inner position.

Thus, an area of the side surface of the outer frame 10 contacting the inner wall of the side plate 36 of the frame stocker 30 is reduced to half or less. Further, a right-angled portion of a lower end of the side surface of the outer frame 10 does not contact the inner wall of the side plate 36 of the frame stocker 30. Therefore, burrs can be suppressed from occurring at the side surface of the outer frame 10 of the lead frame 1.

In addition, the recesses C are formed on the upper surface side of the outer edge portion 10a of the outer frame 10 of the lead frame 1. Accordingly, the number of right-angled portions in the upper end of the side surface of the outer frame 10 of the lead frame 1 can be reduced.

Thus, an amount of a burr occurring in the lead frame 1 can be reduced. In addition, even when the burr occurs in the lead frame 1, the burr occurs only at, of the upper end of the side surface of the outer frame 10, any right-angled portion disposed between adjacent ones of the recesses C. When a distance between the adjacent recesses C is reduced, a length of the burr can be reduced.

Preferably, the width W1 of the flat portion Ex in FIG. 4A is set to be shorter than a distance between a die pad 20 and a lead 24 of the lead frame 1 in FIG. 2 or a distance between leads 24 adjacent to each other.

Thus, even when the burr occurs at the flat portion Ex of the lead frame 1 and then scatters onto an inner portion of the lead frame 1, the length of the burr is shorter than the distance between the die pad 20 and the lead 24 or the distance between the adjacent leads 24. Thus, electric short-circuiting between the die pad 20 and the lead 24 or electric short-circuiting between the adjacent leads 24 can be prevented from occurring.

In addition, the area of each of the side surfaces of the outer frame 10 of the lead frame 1 is reduced, and the number of the right-angled portions in the side surface of the outer frame 10 is smaller. Accordingly, burrs can be also suppressed from occurring at the inner walls of the side plates 36 of the frame stocker 30.

When the lead frame 1 in FIG. 2 is stored in the frame stocker 30, a pair of short side surfaces of the outer frame 10 of the lead frame 1 do not rub the inner walls of the side plates of the frame stocker. Therefore, recesses C and notch step portions G do not have to be formed in the pair of short side surfaces of the outer frame 10 of the lead frame 1.

A conveyance mechanism for various manufacturing devices may contact both the long side surfaces and the short side surfaces of the outer frame 10 in an assembling step of electronic component devices using the lead frame 1, as will be described later. On this occasion, burrs may occur in the short side surfaces of the outer frame 10 of the lead frame 1.

Therefore, the recesses C and the notch step portions G may be formed in the short side surfaces of the outer frame 10 if necessary. Thus, burrs can be prevented from occurring in the short side surfaces of the lead frame 1.

Next, a manufacturing method of the aforementioned lead frame 1 in FIG. 2 will be described.

As shown in FIG. 9, first, a large-sized metal plate 5 for forming multiple lead frames 1 is prepared. The metal plate 5 is formed out of copper, a copper alloy, an iron-nickel alloy, or the like to be 0.1 mm to 0.25 mm thick.

A plurality of frame regions F are defined in the metal plate 5. The aforementioned lead frame 1 in FIG. 2 can be obtained from each of the frame regions F.

Patterns (not shown) of resist layers for obtaining the aforementioned lead frame (frame member) in FIG. 2 are formed on opposite surface sides of each of the frame regions F of the metal plate 5 based on photolithography.

Figure 10A:
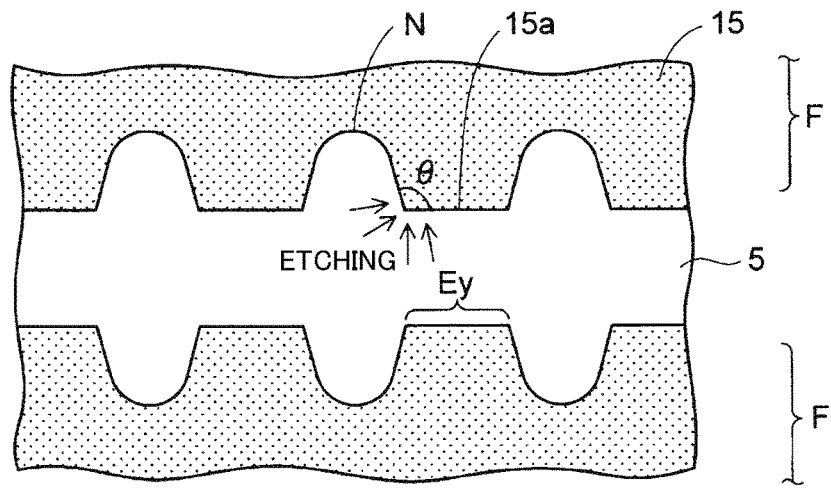
FIGS. 10A and 10B are plan views (Part 2) showing the manufacturing method of the lead frame according to the embodiment.
Figure 10B:
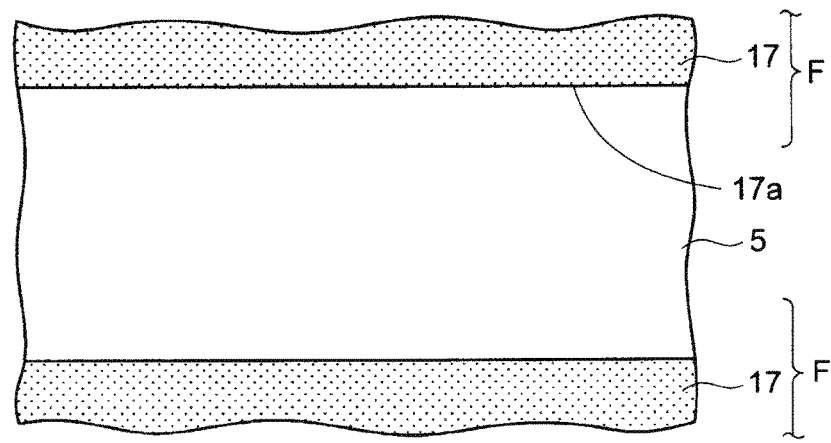

FIGS. 10A and 10B are partial enlarged plan views showing outer edge portions of outer frame patterns of resist layers in a boundary region (portion designated by C) between two frame regions F vertically adjacent to each other in FIG. 9. FIG. 10A is a partial enlarged plan view showing first resist layers 15 on an upper surface side of the metal plate 5. FIG. 10B is a partial enlarged plan view showing second resist layers 17 on a lower surface side of the metal plate 5.

As shown in FIG. 10A, the first resist layers 15 for obtaining patterns of the lead frames 1 in FIG. 2 are patterned respectively in the frame regions F on the upper surface side of the metalplate 5.

Each of the first resist layers 15 includes an outer frame pattern having an oblong outer shape, and a plurality of semicircular notch portions N disposed in side surfaces of opening portions 15a of the outer frame pattern. The plurality of notch portions N are disposed side by side in a long-side direction at predetermined intervals.

Of each of the side surfaces of the opening portions 15a of the first resist layer 15, a portion between adjacent ones of the notch portions N is formed as a flat portion Ey. Although not shown, the whole of the outer frame pattern of the first resist layer 15 is formed into a shape corresponding to an outer frame of the aforementioned lead frame 1 in FIG. 2.

In a similar manner or the same manner, the second resist layers 17 for obtaining the patterns of the lead frames 1 in FIG. 2 are patterned respectively in the frame regions F on the lower surface side of the metal plate 5, as shown in FIG. 10B. The second resist layers 17 are patterned so that integral notch step portions G are formed in lower portions of side surfaces of the outer frames 10 of the lead frames 1 in FIG. 2.

In each of the frame regions F in FIG. 9, side surfaces of opening portions 17a of the second resist layer 17 are disposed linearly in positions corresponding to deep ends of the notch portions N of the first resist layer 15 in FIG. 10A.

The notch portions N of the first resist layer 15 are disposed in order to form recesses C in the outer frame 10 of the aforementioned lead frame 1.

Here, as shown in FIG. 10A, an angle θ at which each of side walls of the notch portions N borders on each of the side surfaces of the opening portions 15a of the first resist layer 15 is set to be larger than 90° but not larger than 135° in order to form each of side wall portions of opening ends of the recesses C into a sufficiently round surface Cs as shown in the aforementioned FIG. 4A.

In addition, of each of the side surfaces of the opening portions 15a of the first resist layer 15, the portion between adjacent ones of the notch portions N is formed as the flat portion Ey in plan view.

Figure 10C:
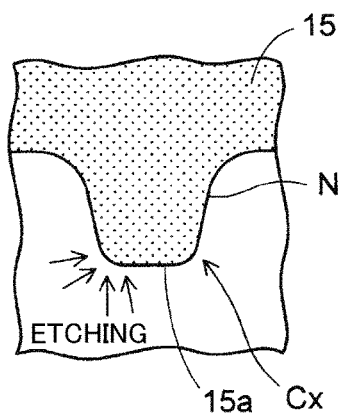
FIG. 10C shows a modification of the lead frame shown in FIG. 10A.

Alternatively, the first resist layer 15 may be patterned so that a portion where each of the side walls of the notch portions N borders on each of the side surfaces of the opening portions 15a of the first resist layer 15 can be formed into a round curved surface Cx, as shown in FIG. 10C that shows a modification of FIG. 10A.

Although not shown particularly, the first and second resist layers 15 and 17 are patterned on the opposite surface sides of the metal plate 5 so that the outer frame 10, an inner frame 12, die pads 20, support bars 22, and leads 24 of the aforementioned lead frame 1 can be obtained in each of the frame regions F of the metal plate 5 in FIG. 9.

Next, the metal plate 5 is wet-etched from its opposite sides through the opening portions 15a and 17a while using the first and second resist layers 15 and 17 on the opposite surface sides of the metal plate 5 as masks.

When copper is used as the material of the metal plate 5, a ferric chloride solution, a cupric chloride solution, an ammonium copper chloride solution, or the like can be used as an etchant. A spray etching device can be used preferably as an etching device.

Figure 11A:
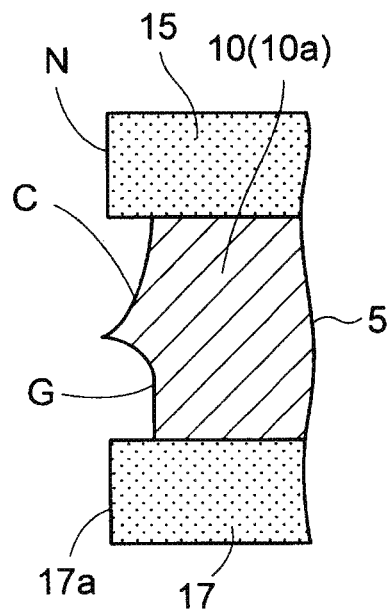
FIGS. 11A and 11B are sectional views (Part 3) showing the manufacturing method of the lead frame according to the embodiment.

On this occasion, the metal plate 5 is perforated so that an etching face from the notch portions N (FIG. 10A) of the first resist layer 15 on the upper surface side of the metal plate 5 and an etching face from the side surfaces (FIG. 10B) of the opening portions 17a of the second resist layer 17 on the lower surface side of the metal plate 5 can communicate with each other, as shown in FIG. 11A.

FIG. 11A shows an etching section of the metal plate 5 in a region inside each of the notch portions N of the first resist layer 15 in FIG. 10A.

Figure 11B:
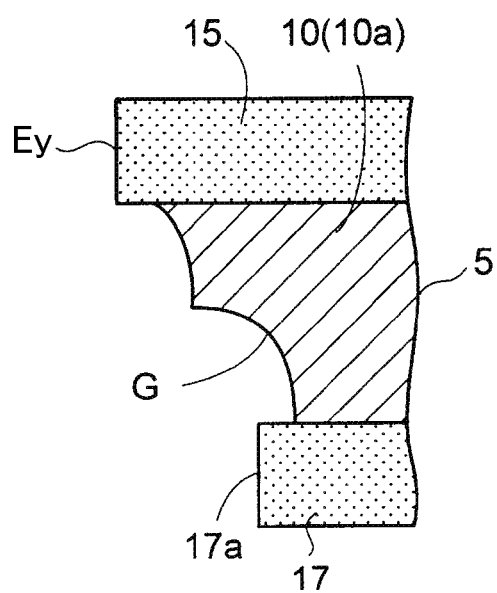

Simultaneously, the metal plate 5 is perforated so that the etching face from the flat portions Ey (FIG. 10A) of the first resist layer 15 on the upper surface side of the metal plate 5 and the etching face from the side surfaces (FIG. 10B) of the opening portions 17a of the second resist layer 17 on the lower surface side of the metal plate 5 can communicate with each other, as shown in FIG. 11B.

FIG. 11B shows an etching section of the metal plate 5 in a region inside each of the flat portions Ey of the first resist layer 15 in FIG. 10A.

Thus, the outer frame 10 which is shaped like a rectangle is formed. At the same time, the recesses C are formed to extend from upper surfaces of outer edge portions 10a of the outer frame 10 to side surfaces of the outer edge portions 10a, and the notch step portions G are formed to extend from lower surfaces of the outer edge portions 10a to the side surfaces of the outer edge portions 10a.

FIGS. 12A and 12B show a state in which the metal plate 5 has been wet-etched from the opposite sides to be perforated and the first and second resist layers 15 and 17 have been removed.

FIG. 12A is a partial enlarged plan view showing the upper surface sides of the outer edge portions 10a of the outer frames 10 of frame members 1x. FIG. 12B is a partial enlarged plan view showing the lower surface sides of the outer edge portions 10a of the outer frames 10 of the frame members 1x.

As shown in FIG. 12A, the metal plate 5 is patterned so that the frame members 1x including the outer frames 10 in the respective frame regions F in FIG. 9 are obtained.

As shown in FIG. 12A, the plurality of recesses C are formed side by side on each of the upper surface sides of the outer edge portions 10a of the outer frames 10. Refer to the aforementioned FIG. 10A. on this occasion. The angle θ at which each of the side walls of the notch portions N of the first resist layers 15 borders on the side surface of the opening portion 15a of the first resist layer 15 is set to be larger than 90°. The metal plate 5 is etched isotropically from lower ends of opening ends of the notch portions N of the first resist layers 15 in FIG. 10A.

Thus, as shown in FIG. 12A, the side wall portions of the horizontal opening ends of the recesses C are etched to be chamfered so that each of the side wall portions of the horizontal opening ends of the recesses C is rounded and formed into a curved surface serving as a round surface Cs.

When the angle θ of each of the opening ends of the notch portions N of the first resist layer 15 in FIG. 10A is set to be not larger than 90°, the side wall portion of the horizontal opening end of the recess C cannot be chamfered easily so that the side wall portion of the horizontal opening end of the recess C is formed into a round surface having small roundness. Accordingly, the angle θ is preferably set to exceed 90° in order to obtain a round surface with sufficient roundness.

Alternatively, when the pattern of the first resist layer 15 according to the aforementioned modification of FIG. 10A is used, the side wall portion of the opening end of the recess C is formed into a round surface Cs with sufficient roundness correspondingly to the curved surface Cx of the opening end of the notch portion N of the first resist layer 15.

As shown in FIG. 12B, the integral notch step portions G are formed on the lower surface sides of the outer edge portions 10a of the outer frames 10. Each of the notch step portions G is formed integrally to extend from one long-side end E1 of the outer edge portion 10a of the outer frame 10 to the other long-side end E2 thereof.

As shown in FIG. 12A, of an upper end of each of the side surfaces of the outer frames 10, a portion between adjacent ones of the recesses C is formed into a flat portion Ex which is linear in plan view, correspondingly to the flat portion Ey of the side surface of the first resist layer 15. Thus, it is possible to stably form the lead frame having a desired width, as described above.

In addition, the metal plate 5 is etched isotropically in a range of from the notch portions N of the first resist layers 15 to the middle of the thickness of the metal plate 5 so that the recesses C are disposed in the side surfaces of the outer frames 10. Therefore, the depth of each of the recesses C is formed to be deeper on the opening end side (side surface side of the outer frame 10) than on the deep side (inner side of the outer frame 10) (see FIG. 11A)

Although not shown particularly, the metal plate 5 is wet-etched from the opposite surface sides to be perforated simultaneously inside the respective frame regions F of the metal plate 5 in FIG. 9, using the patterns of the first and second resist layers 15 and 17 on the opposite surface sides as the masks.

Thus, the inner frame 12, the die pads 20, the support bars 22 and the leads 24 are formed to be coupled to the outer frame 10 inside each of the frame regions of the metal plate 5.

Figure 13:
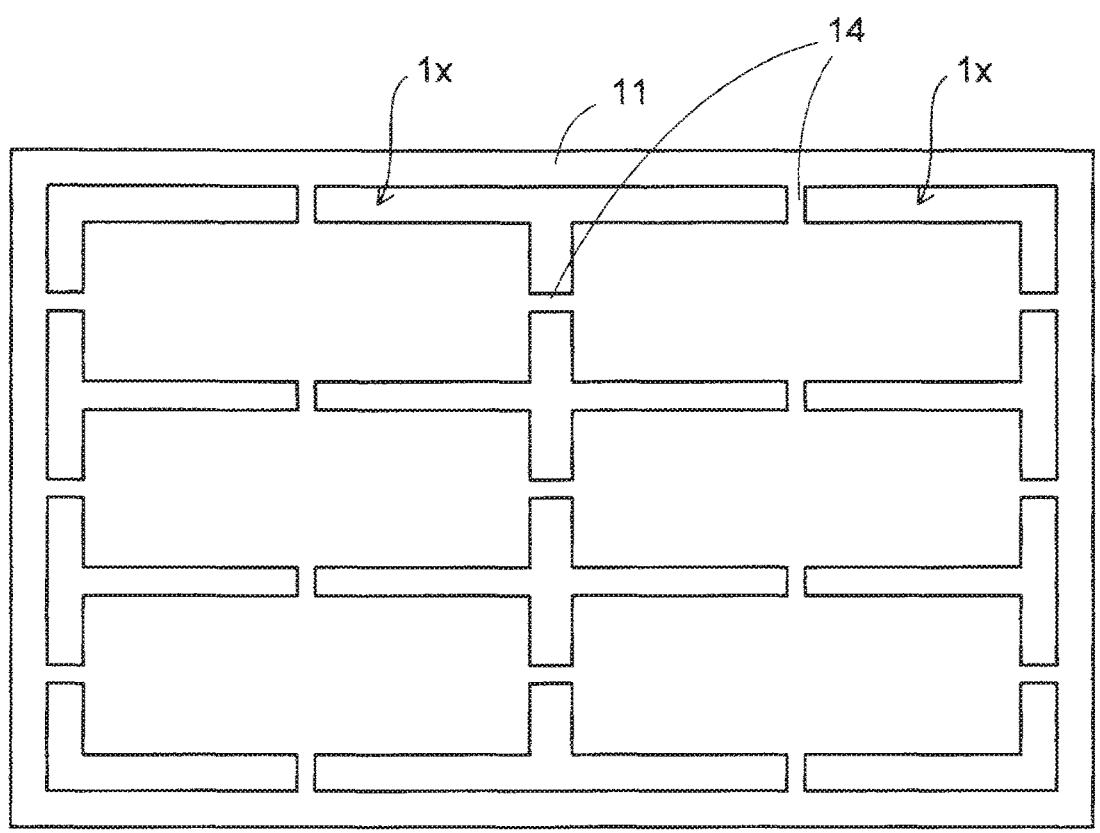
FIG. 13 is a plan view (Part 5) showing the manufacturing method of the lead frame according to the embodiment.

In this manner, the frame members 1x each having the same structure as the lead frame 1 in FIG. 2 are formed respectively in the frame regions F of the metal plate 5 in FIG. 9, as shown in FIG. 13. At this point of time, the frame members 1x disposed in the frame regions F respectively are coupled to an outer peripheral frame 11 in a state in which the frame members 1x are connected to one another through coupling portions 14.

In each of the frame members 1x in FIG. 3, the respective patterns of the outer frame 10, the inner frame 12, the die pads 20, the support bars 22 and the leads 24 are omitted.

Then, the coupling portions 14 of the metal plate 5 in FIG. 13 are cut to separate the frame members 1x disposed in the frame regions F from one another. As a result, lead frames 1 are obtained individually.

In the aforementioned manner, the aforementioned lead frames 1 according to the embodiment as shown in FIG. 2 are manufactured.

Figure 14:
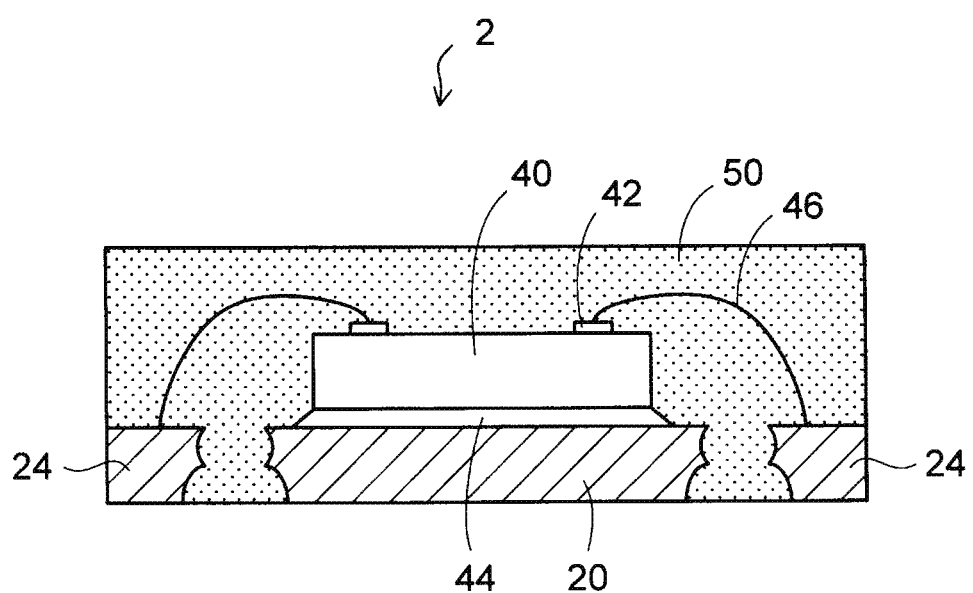
FIG. 14 is a sectional view showing an electronic component device according to the embodiment.

Next, a method of using the aforementioned lead frame in FIG. 2 to build electronic component devices will be described. As shown in FIG. 14, a semiconductor chip 40 provided with connection terminals 42 on its front surface is prepared. A back surface of the semiconductor chip 40 is bonded on each of the die pads 20 of the product regions R of the lead frame 1 in FIG. 2 by an adhesive agent 44.

Next, the connection terminals 42 of the semiconductor chip 40 and the leads 24 are connected to each other respectively through metal wires 46 by a wire bonding method. The metal wires 46 are made of gold, copper, or the like.

Further, a sealing resin (encapsulation resin) 50 for sealing (encapsulating) the die pads 20, the semiconductor chips 40, the metal wires 46, the leads 24, etc. in the product regions R is formed all over the lead frame 1. The sealing resin 50 is formed to cover the upper surface side of the lead frame 1 but to expose the lower surface side of the lead frame 1.

Then, the sealing resin 50 and the lead frame 1 are cut, and the outer frame 10 and the inner frame 12 are separated from the support bars 22 and the leads 24 so that the respective product regions R can be obtained individually.

Thus, the electronic component devices 2 according to the embodiment are obtained. As each of the semiconductor chips 40, for example, a memory, a power supply controller, or an LSI chip such as a CPU can be used. However, various electronic components may be mounted alternatively.

Figure 15:
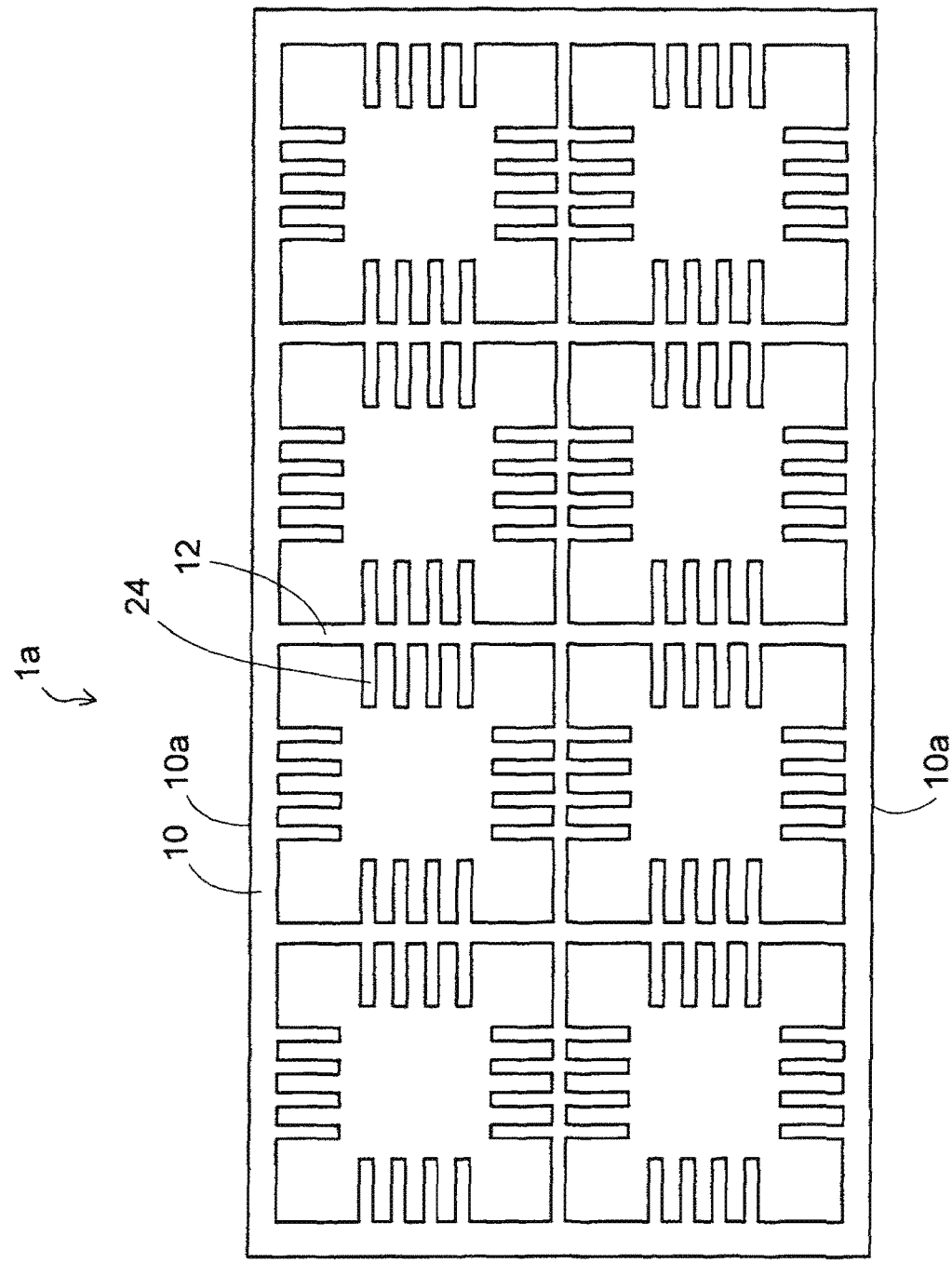
FIG. 15 is a plan view showing a lead frame according to a modification of the embodiment.

FIG. 15 shows a lead frame 1a according to a modification of the embodiment. Die pads 20 and support bars 22 may be removed from the lead frame 1 of FIG. 2, as in the lead frame 1a according to the modification.

Figure 16:
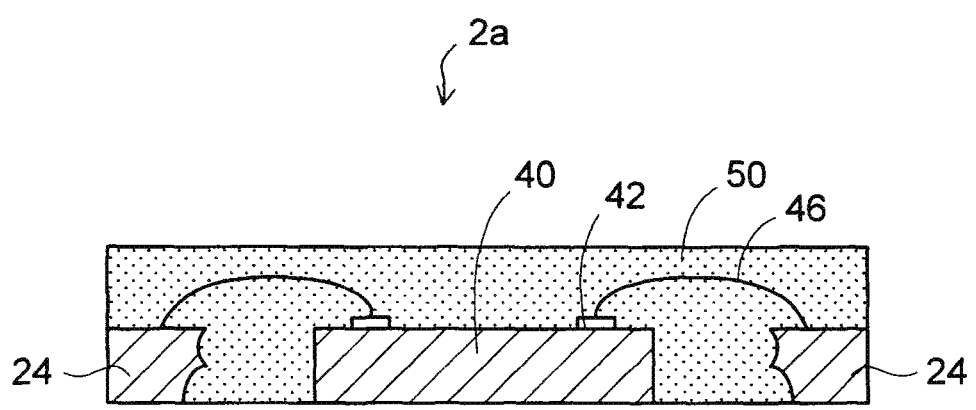
FIG. 16 is a sectional view showing an electronic component device according to the modification of the embodiment.

FIG. 16 shows an electronic component device 2a according to the modification, which uses the lead frame 1a according to the modification as shown in FIG. 15. In the electronic component device 2a according to the modification, as shown in FIG. 16, the die pad 20 is removed from the electronic component device 2 in FIG. 14, and a back surface of a semiconductor chip 40 is exposed from a lower surface of a sealing resin 50. An insulating sheet may be provided on the back surface of the semiconductor chip 40.

Figure 17A:
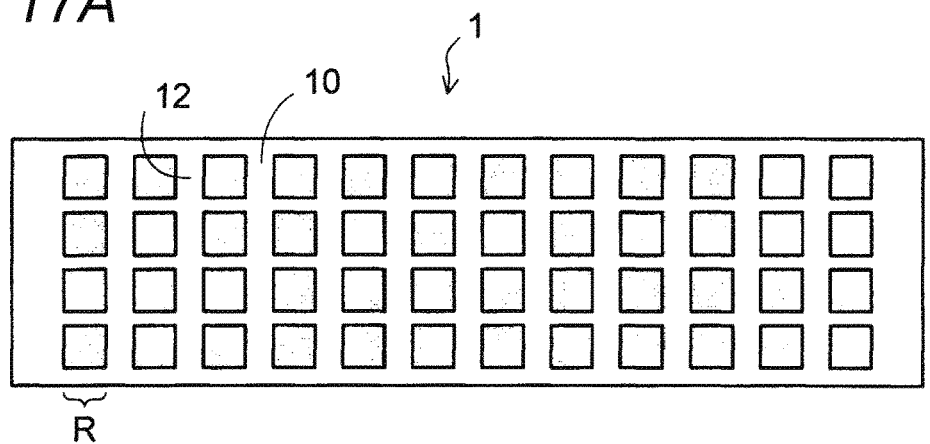
FIGS. 17A to 17C are plan views showing a variety of layouts of a plurality of product regions inside the lead frame according to the embodiment.
Figure 17B:
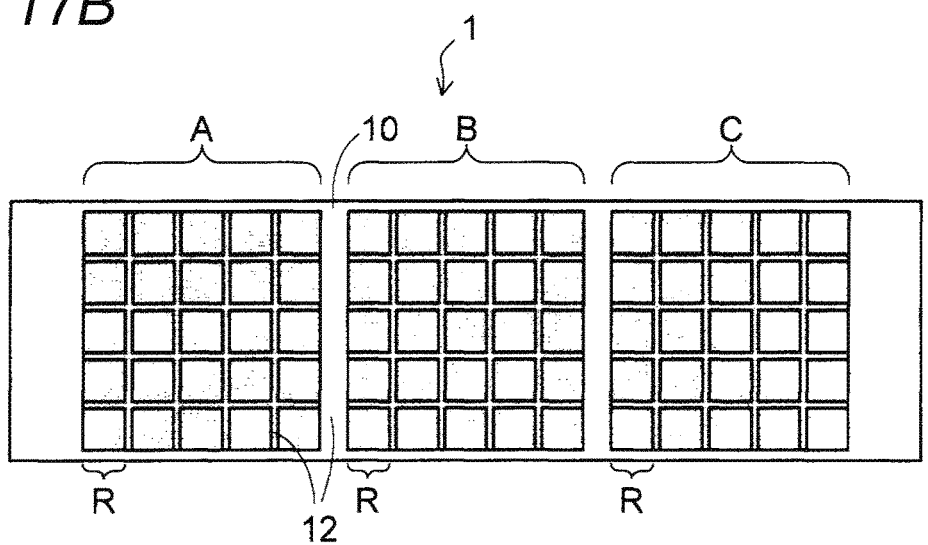
Figure 17C:
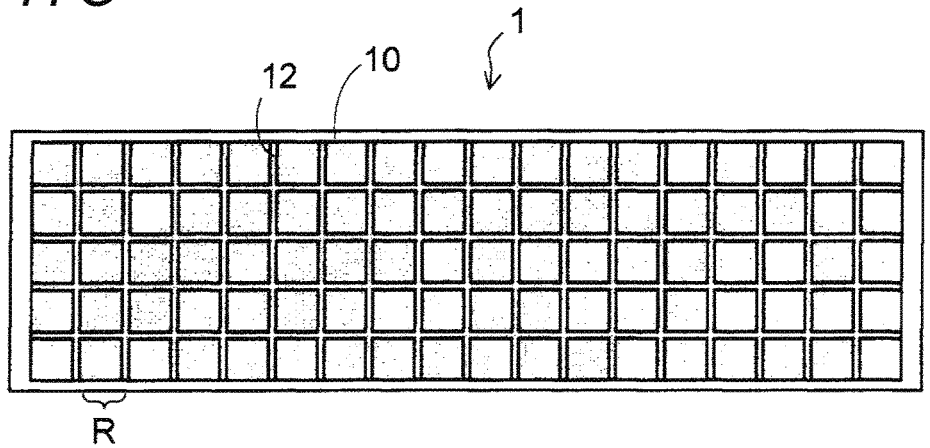

FIGS. 17A to 17C are plan views showing a variety of layouts of product regions R inside the lead frame 1.

In an example of FIG. 17A, the product regions R are disposed dispersively inside the lead frame 1. An inner frame 12 located among the product regions R is set to be wide. When electronic component devices 2 in FIG. 14 are built from the lead frame 1 in FIG. 17A, the respective product regions R are sealed with a sealing resin 50 individually. Further, the inner frame 12 exposed from the sealing resin 50 is cut and punched. As a result, the electronic component devices are obtained individually.

In FIG. 17B, a plurality of blocks in each of which a plurality of product regions R are provided adjacently to one another are disposed. In an example of FIG. 17B, three blocks A, B and C are disposed inside the lead frame 1. An inner frame 12 is set to be narrow inside each of the blocks A, B and C, but set to be wide between adjacent ones of the blocks A, B and C.

When electronic component devices 2 in FIG. 14 are built from the lead frame 1 in FIG. 17B, each of the blocks A, B and C is collectively sealed with a sealing resin 50. Further, in the block A, B, C, the sealing resin 50 and the lead frame 1 are cut along boundaries among the product regions R. As a result, the electronic component devices are obtained individually.

In addition, in FIG. 17C, all product regions R are disposed adjacently to one another inside the lead frame 1. When electronic component devices 2 in FIG. 14 are built from the lead frame 1 in FIG. 17C, all the product regions R are sealed collectively with a sealing resin 50. Further, the sealing resin 50 and the lead frame 1 are cut along boundaries among the product regions R. As a result, the electronic component devices are obtained individually.

The electronic component device 2 having the aforementioned structure of FIG. 14 is obtained from each of the product regions R inside the lead frame 1 in FIG. 17B or the lead frame 1 in FIG. 17C.

In the aforementioned embodiment, the lead frame 1, 1a and the electronic component devices 2, 2a are applied to a QFN (Quad Flat Non-Leaded Package) structure has been illustrated.

In addition thereto, the invention may be applied to outer frames of various lead frames used for a QFP (Quad Flat Package), an SOP (Small Outline Package) etc.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

1) A method of manufacturing a lead frame, the method comprising:

a) preparing a metal plate in which at least one frame region is defined;

b) forming patterns of resist layers respectively on opposite surfaces of the metal plate in the frame region;

c) wet-etching the metal plate from the opposite surface sides using the resist layers as masks to thereby form a frame member in the frame region;

d) removing the resist layers; and e) separating the frame member from the frame region to thereby obtain the lead frame, wherein the frame member comprises an outer frame, and the outer frame comprises:

one surface;

another surface that is opposite to the one surface;

a side surface between the one surface and the other surface;

a recess that is formed to extend from the one surface to the side surface; and a notch step portion that is formed to extend from the other surface to the side surface.

2) The method according to clause (1), wherein the outer frame further comprises a curved surface that is positioned between a side wall of the recess and the side surface.

3) The method according to clause (1), wherein in the step b), one of the resist layers that is formed on the one surface of the metal plate includes an outer frame pattern, and a notch portion formed in a side surface of the outer frame pattern, the recess is formed to correspond to the notch portion of the resist layer, and an angle that is formed by a side wall of the notch portion and the side surface of the outer frame pattern is larger than 90° but not larger than 135° in plan view.

4) The method according to clause (1), wherein, in the step c),
the notch step portion is formed to extend from one end of the side surface to the other end of the side surface in a long-side direction of the outer frame.

5) The method according to clause (1), wherein, in the step c), the recess has a plurality of recesses,
the plurality of recesses are disposed side by side at predetermined intervals in a long-side direction of the outer frame, and
a portion of an end of the side surface between adjacent ones of the plurality of recesses is formed into a linear shape.

6) The method according to clause (1), wherein, in the step c), the recess and the notch step portion are formed in the side surface that is parallel with a long-side direction of the outer frame.

What is claimed is:

1. A lead frame comprising an outer frame, wherein the outer frame comprises:
    one surface;
    another surface that is opposite to the one surface;
    a side surface between the one surface and the other surface;
    a recess that is formed to extend from the one surface to the side surface; and
    a notch step portion that is formed to extend from the other surface to the side surface, wherein the notch step portion is formed to extend from one end of the side surface to the other end of the side surface in a long-side direction of the outer frame.

2. The lead frame according to claim 1, wherein the outer frame further comprises a curved surface that is positioned between a side wall of the recess and the side surface.

3. The lead frame according to claim 1, wherein
    the recess comprises a plurality of recesses,
    the plurality of recesses are disposed side by side at predetermined intervals, and
    a portion of an end of the side surface between adjacent ones of the plurality of recesses is formed into a linear shape.

4. The lead frame according to claim 1, wherein
    the recess and the notch step portion are formed in the side surface that is parallel with the long-side direction of the outer frame.

5. The lead frame according to claim 1, wherein
    an inner surface of the recess and an inner surface of the notch step portion are formed into concavely curved surfaces respectively.

* * * * *